United States Patent
Freund

(10) Patent No.: US 7,228,259 B2
(45) Date of Patent: Jun. 5, 2007

(54) METHOD AND APPARATUS FOR STRUCTURE-PRESERVING REDUCED-ORDER MODELING

(75) Inventor: Roland Wilhelm Freund, New Providence, NJ (US)

(73) Assignee: Lucent Technologies Inc., Murray Hill, NJ (US)

( * ) Notice: Subject to any disclaimer, the term of this patent is extended or adjusted under 35 U.S.C. 154(b) by 373 days.

(21) Appl. No.: 10/881,190

(22) Filed: Jun. 30, 2004

(65) Prior Publication Data
US 2006/0004551 A1    Jan. 5, 2006

(51) Int. Cl.
G06F 17/50    (2006.01)
G06F 3/00     (2006.01)

(52) U.S. Cl. .................................... 703/2; 703/13

(58) Field of Classification Search .............. 703/2, 703/13; 716/2–6
See application file for complete search history.

(56) References Cited

U.S. PATENT DOCUMENTS

| 5,537,329 | A |    | 7/1996  | Feldmann et al. |       |
|-----------|---|----|---------|-----------------|-------|
| 5,689,685 | A |    | 11/1997 | Feldmann et al. |       |
| 6,023,573 | A |    | 2/2000  | Bai et al.      |       |
| 6,041,170 | A |    | 3/2000  | Feldmann et al. |       |
| 6,801,881 | B1| *  | 10/2004 | Shah ........... | 703/2 |
| 2004/0261042 | A1 | * | 12/2004 | Lee et al. |    |
| 2005/0021319 | A1 | * | 1/2005  | Li et al.  |    |

OTHER PUBLICATIONS

A. Odabasioglu et al., "PRIMA: Passive Reduced-Order Interconnect Macromodeling Algorithm," Tech. Dig. IEEE/ACM International Conference on Computer-Aided Design, pp. 58-65, Los Alamitos, California, 1997.
R.W. Freund, "Passive Reduced-Order Models for Interconnect Simulation and Their Computation Via Krylov-Subspace Algorithms," Proc. 36th ACM/IEEE Design Automation Conference, pp. 195-200, New York, New York, 1999.
R.W. Freund, "Krylov-Subspace Methods for Reduced-Order Modeling in Circuit Simulation," J. Comput. Appl. Math., 123 (1-2), pp. 395-421, 2000.
T-J. Su et al., "Model Reduction and Control of Flexible Structures Using Krylov Vectors," J. Guidance, vol. 14, No. 2, pp. 260-267, 1991.
A.E. Ruehli, "Equivalent Circuit Models for Three-Dimensional Multiconductor Systems," IEEE Transactions on Microwave Theory and Techniques, vol. MTT-22, No. 3, pp. 216-221, Mar. 1974.

* cited by examiner

*Primary Examiner*—Thai Phan

(57) ABSTRACT

A processing unit of an analysis system comprises a processor coupled to a memory, and is configured to generate a structure-preserving reduced-order model of a circuit, device or system. The reduced-order model in one embodiment is generated by projection of input matrices characterizing the circuit, device or system onto at least one block Krylov subspace, the block Krylov subspace having a corresponding basis matrix. The projection utilizes at least one matrix that has a column range which includes a corresponding portion of the block Krylov subspace but is not itself the basis matrix of the block Krylov subspace. The processing unit generates a frequency response or other signal characterizing the circuit, device or system, based at least in part on the reduced-order model, and an associated output unit presents the generated signal in a user-perceptible format.

20 Claims, 4 Drawing Sheets

METHOD AND APPARATUS FOR STRUCTURE-PRESERVING REDUCED-ORDER MODELING

FIELD OF THE INVENTION

The present invention relates generally to modeling of electronic circuits, mechanical systems, and other types of circuits, devices or systems, and more particularly relates to reduced-order modeling techniques based on block subspaces.

BACKGROUND OF THE INVENTION

Electronic circuits and other circuits, devices or systems often contain large linear subnetworks of passive components. Such subnetworks may represent, by way of example, interconnect information automatically extracted from large RLC network layouts, models of integrated circuit packages, or models of wireless propagation channels. Often these subnetworks are so large that they need to be replaced by much smaller reduced-order models, before any numerical simulation becomes feasible. The process of generating such reduced-order models is referred to herein as reduced-order macromodeling, or more generally, reduced-order modeling. Ideally, the resulting reduced-order models will produce a good approximation of the input-output behavior of the original subnetwork, at least in a limited domain of interest, such as a particular frequency range.

In recent years, reduced-order modeling techniques based on Padé approximation have been recognized to be powerful tools for various circuit simulation tasks. The first such technique was asymptotic waveform evaluation, which uses explicit moment matching. More recently, the attention has moved to reduced-order models generated by means of Krylov-subspace algorithms, which avoid the typical numerical instabilities of explicit moment matching.

An approach known as PVL, and its multi-port version MPVL, use variants of the Lanczos process to stably compute reduced-order models that represent Padé or matrix-Padé approximations of the circuit transfer function.

The SyPVL approach, and its multi-port version SyMPVL, are versions of PVL and MPVL, respectively, that are tailored to RLC circuits. By exploiting the symmetry of RLC transfer functions, the computational costs of SyPVL and SyMPVL are only half of those of general PVL and MPVL. The Arnoldi process is another popular Krylov-subspace algorithm. Arnoldi-based reduced-order model techniques have recently been proposed. These models are not defined by Padé approximation, and as a result, in general, they are not as accurate as a Padé-based model of the same size. In fact, Arnoldi-based models are known to match only half as many moments as Lanczos-based models. An example of an Arnoldi-based reduced-order modeling technique is the PRIMA technique, described in A. Odabasioglu et al., "PRIMA: passive reduced-order interconnect macromodeling algorithm," Tech. Dig. 1997 IEEE/ACM International Conference on Computer-Aided Design, pp. 58–65, Los Alamitos, Calif., 1997, which is incorporated by reference herein.

In many applications, in particular those related to VLSI interconnect, the reduced-order model is used as a substitute for the full-blown original model in higher-level simulations. In such applications, it is very important for the reduced-order model to maintain the passivity properties of the original circuit. It has been shown that the SyMPVL technique is passive for RC, RL, and LC circuits. However, the Padé-based reduced-order model that characterizes SyMPVL cannot be guaranteed to be passive for general RLC circuits. On the other hand, the Arnoldi-based reduction technique PRIMA produces passive reduced-order models for general RLC circuits. PRIMA employs a block version of the Arnoldi process and then obtains reduced-order models by projecting the matrices defining the RLC transfer function onto the Arnoldi basis vectors.

While PRIMA generates provably passive reduced-order models, it does not preserve other structures, such as reciprocity or the block structure of the circuit matrices, inherent to RLC circuits. This has motivated the development of algorithms such as ENOR and its variants that generate passive and reciprocal reduced-order models, yet still match as many moments as PRIMA. However, the moment-matching property of the PRIMA models is not optimal. In fact, the PRIMA models match only half as many moments as optimal, but non-passive, moment-matching techniques such as SyMPVL.

Accordingly, a need exists for an improved reduced-order modeling technique that overcomes the disadvantages of PRIMA.

SUMMARY OF THE INVENTION

The present invention meets the above-noted need by providing a structure-preserving reduced-order modeling technique referred to herein, in the context of an illustrative embodiment, as SPRIM.

In accordance with one aspect of the invention, a processing unit of an analysis system comprises a processor coupled to a memory, and is configured to generate a structure-preserving reduced-order model of a circuit, device or system. The reduced-order model is generated by projection of input matrices characterizing the circuit, device or system onto at least one block subspace, such as a block Krylov subspace, the block Krylov subspace having a corresponding basis matrix. The projection utilizes at least one matrix that has a column range which includes a corresponding portion of the block Krylov subspace but is not itself the basis matrix of the block Krylov subspace. The processing unit generates a frequency response or other signal characterizing the circuit, device or system, based at least in part on the reduced-order model, and an associated output unit presents the generated signal in a user-perceptible format.

Advantageously, a given SPRIM reduced-order model in the illustrative embodiment provides an improved approximation of the circuit, device or system relative to a PRIMA reduced-order model of the circuit, device or system, by matching approximately twice as many moments as the PRIMA reduced-order model.

In addition, the SPRIM reduced-order model preserves passivity properties of the circuit, device or system.

Yet another advantage of the illustrative embodiment is that the SPRIM reduced-order model can be represented in a second-order form, and thus preserves reciprocity properties of the circuit, device or system.

DETAILED DESCRIPTION OF THE INVENTION

The invention will be described below in conjunction with illustrative embodiments of a circuit analysis system and an associated structure-preserving reduced-order interconnect modeling process referred to herein as SPRIM. It should be understood, however, that the invention is not limited to use with the particular system and process described, but is instead more generally applicable to any circuit, device or system modeling application in which it is desirable to provide improved performance relative to conventional techniques such as the PRIMA technique.

1. Circuit Analysis System

Figure 1:
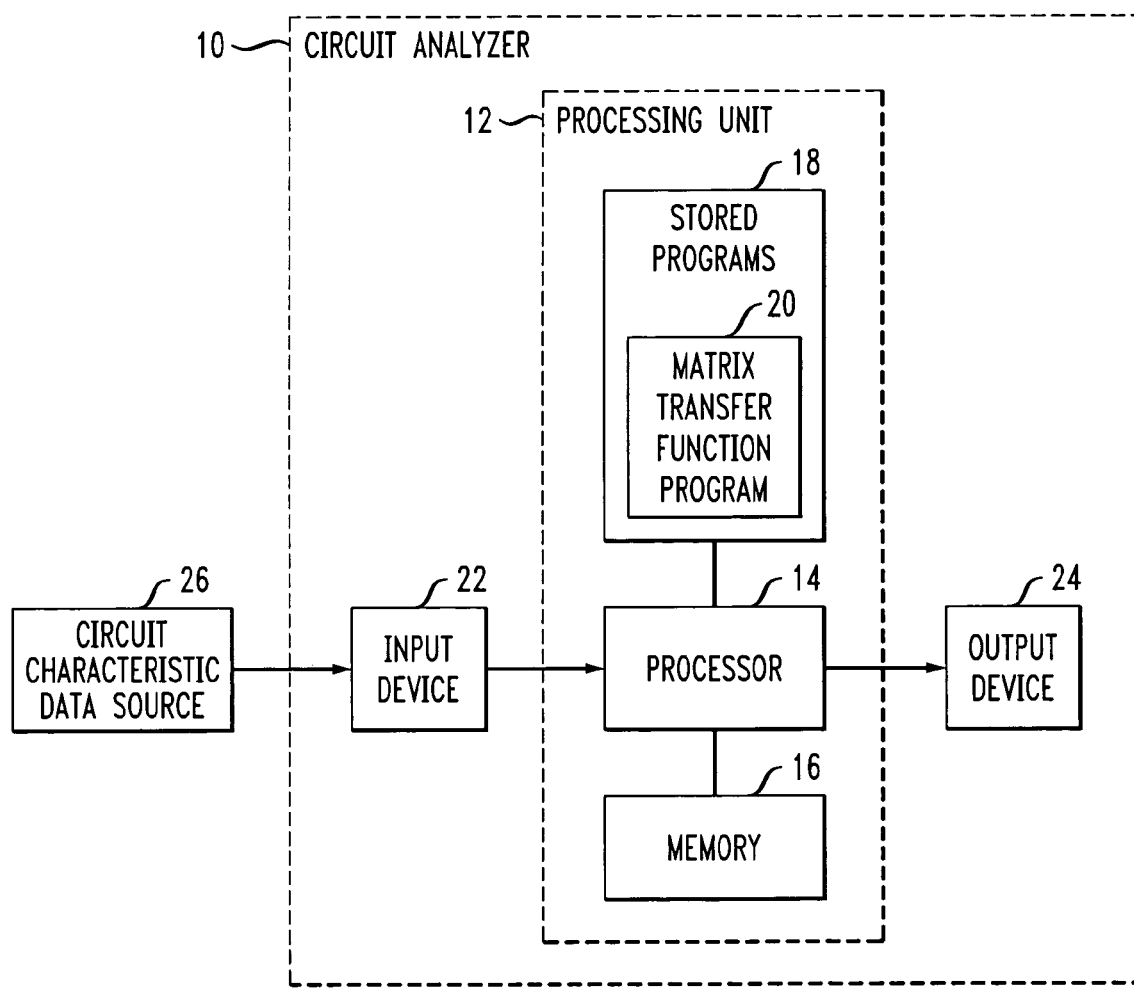
FIG. 1 is a block diagram of an exemplary circuit analysis system in which the present invention is implemented.

FIG. 1 shows an exemplary circuit analysis system in which the present invention is implemented. The system includes a circuit analyzer 10 and a circuit characteristic data source 26. The circuit analyzer 10 comprises a processing unit 12, an input device 22 and an output device 24. The processing unit 12 comprises a processor 14, memory 16, and stored programs 18, including a transfer function program 20.

The processing unit 12 may comprise an otherwise conventional computer, workstation, server, or other type of processing device or system, suitably configured with one or more software programs for implementing a structure-preserving reduced-order interconnect modeling process in accordance with the invention.

A description of the circuit to be analyzed is provided from the circuit characteristic data source 26 through input device 22 to the processor 14. The data source 26 may be any source for providing information to a computer or other processing device or system, such as a floppy disk, CD-ROM, DAT, network server, web server or other source containing a circuit characteristic file. It also may be a human operator that enters the data manually. The input device 22 may be a keyboard, a floppy disk drive, a CD-ROM drive, a network interface or another data reading device.

The processor 14 receives the circuit characteristic data from the circuit characteristic data source 26 through the input device 22. The received circuit characteristic data is stored in memory 16 for processing in accordance with the present invention to generate, for example, a frequency response signal representing the approximated or predicted frequency response of the circuit. The generated frequency response data of a linear subcircuit may be a sub-goal in the overall analysis of a larger, non-linear circuit. Alternatively, the circuit analyzed may be an independent linear circuit.

The generated frequency response data may be converted by the processor 14 into a graphic representation for plotting the approximated frequency response in volts, amperes, or other units, as a function of frequency. The graphic representation is sent to an output device 24 such as a display for displaying the predicted frequency response of the circuit under analysis. Alternatively, the output device 24 may include specialized graphics programs to convert the generated frequency response signal to a displayed graphic. The generated frequency response data may include determined poles, zeroes, residues or other information listed in a file for output as columns or tables of text by the output device 24. The output device 24 may be a CRT display, a hard copy printer, or any other device for presenting the desired output data in a user-perceptible format. Output device 24 is an example of an element more generally referred to herein as an "output unit."

The circuit analyzer 10 implements the SPRIM algorithm as described in conjunction with FIG. 2 below. More specifically, the algorithm in the illustrative embodiment is implemented in software that is stored in elements 16 or 18 of the processing unit 12, and executed by processor 14 of the processing unit 12.

Additional details regarding conventional aspects of circuit analysis systems such as the system of FIG. 1 can be found in, for example, U.S. Pat. Nos. 5,537,329, 5,689,685, 6,023,573, and 6,041,170, all of which are hereby incorporated by reference herein.

The particular circuit analysis system configuration shown in FIG. 1 is presented by way of illustrative example only, and should not be construed as limiting the invention in any way. As indicated previously, the invention does not require any particular system configuration. Numerous alternative arrangements of system elements may be used to implement SPRIM or other structure-preserving reduced-order modeling process in accordance with the present invention. Moreover, the invention can be applied to modeling of any circuit, device or system, as well as combinations of circuits, devices and systems. The term "circuit, device or system" as used herein should therefore be understood to include a circuit, a device, a system, or any arrangement of two or more such elements.

2. RLC Circuit Equations

In this section, we briefly review the form of RLC circuit equations. It is to be appreciated, however, that the invention is not limited to use with RLC circuits. Those skilled in the art will recognize that the described techniques can be readily adapted for use with other types of devices or systems.

The connectivity of a circuit can be captured using a directional graph. The nodes of the graph correspond to the nodes of the circuit, and the edges of the graph correspond to each of the circuit elements. An arbitrary direction is assigned to graph edges, so one can distinguish between the source and destination nodes. The adjacency matrix, E, of the directional graph describes the connectivity of a circuit. Each row of E corresponds to a graph edge and, therefore, to a circuit element. Each column of E corresponds to a graph or circuit node. The column corresponding to the datum (ground) node of the circuit is omitted in order to remove redundancy. By convention, a row of E contains +1 in the column corresponding to the source node, −1 in the column corresponding to the destination node, and 0 everywhere else. Kirchhoff's laws, which depend only on connectivity, can be expressed in terms of E as follows:

KCL: $E^T i_b = 0$,

KVL: $E v_n = v_b$. (1)

Here, the vectors $i_b$ and $v_b$ contain the branch currents and voltages, respectively, and $v_n$ the non-datum node voltages.

We are interested in analyzing RLC circuits, and for simplicity, we assume that the circuit is excited just by current sources. In this case, E, $v_b$, and $i_b$ can be partitioned according to circuit-element types as follows:

$$E = \begin{bmatrix} E_i \\ E_g \\ E_c \\ E_l \end{bmatrix}, v_b = \begin{bmatrix} v_i \\ v_g \\ v_c \\ v_l \end{bmatrix}, i_b = \begin{bmatrix} i_i \\ i_g \\ i_c \\ i_l \end{bmatrix}.$$

Here, the subscripts i, g, c, and l stand for branches containing current sources, resistors, capacitors, and inductors, respectively.

The set of circuit equations is completed by adding so-called branch constitutive relationships (BCRs), which describe the physical behavior of the circuit elements. In the case of RLC circuits, the BCRs are as follows:

$$i_i = -I_t(t), \; i_g = Gv_g, \; i_c = C\frac{d}{dt}v_c, \; v_l = L\frac{d}{dt}i_l. \tag{2}$$

Here, $I_t(t)$ is the vector of current-source values, G and C are diagonal matrices whose diagonal entries are the conductance and capacitance values of each element. Clearly, these values are positive for any physical circuit. The inductance matrix L is always symmetric and positive semi-definite. In the absence of inductive coupling, L is also a diagonal matrix. However, in the case of inductive coupling, the matrix L is full in general. An important special case is inductance matrix L whose inverse, the so-called susceptance matrix, $$S = L^{-1} \tag{3}$$

is sparse.

The modified nodal formulation (MNA) of the circuit equations is obtained by combining equations (1) with (2), and eliminating as many current unknowns as possible. For RLC circuits, only inductor currents are left as unknowns. The resulting MNA equations are $$Gx + C\frac{d}{dt}x = BI_t(t), \; \text{where} \tag{4}$$

$$G = \begin{bmatrix} E_g^T G E_g & E_l^T \\ -E_l & 0 \end{bmatrix}, x = \begin{bmatrix} v_n \\ i_l \end{bmatrix},$$

$$C = \begin{bmatrix} E_c^T C E_c & 0 \\ 0 & L \end{bmatrix}, B = \begin{bmatrix} E_i^T \\ 0 \end{bmatrix}.$$

We remark that G, C, and L are symmetric positive definite matrices. This implies that $$G + G^T \geq 0 \text{ and } C \geq 0 \tag{5}$$

Here, $M \geq 0$ means that the matrix M is symmetric and positive semi-definite.

We view the RLC circuit as an m-terminal component, and next, we determine its network functions. Since we allowed only current sources, it is natural to determine the matrix Z(s) of Z-parameters. By applying the Laplace transform to (4) and assuming zero initial conditions, we obtain $$(G+sC)X = BI_s(s), \; V_i = B^T X. \tag{6}$$

Here, X, $I_s(s)$, and $V_i$ represent the Laplace transforms of the unknown vector x, the excitation current $I_t(t)$, and the vector of voltages across the excitation sources, respectively. Eliminating X in (6) gives $$V_i = [E_i 0]X = Z(s)I_s(s),$$

where $$Z(s) = B^T(G+sC)^{-1}B. \tag{7}$$

3. Order Reduction Via Projection

In this section, we discuss reduced-order modeling via one-sided projection onto block Krylov subspaces.

We consider general m-input m-output transfer functions of the form $$Z(s) = B^T(G+sC)^{-1}B, \tag{8}$$

where the matrices G and C are N×N, and B is N×m. We remark that N is called the state-space dimension of (8).

Moreover, we assume that G, C, and B have the block structure $$G = \begin{bmatrix} G_1 & G_2^T \\ -G_2 & 0 \end{bmatrix}, C = \begin{bmatrix} C_1 & 0 \\ 0 & C_2 \end{bmatrix}, B = \begin{bmatrix} B_1 \\ 0 \end{bmatrix}, \tag{9}$$

where the subblocks $G_1$, $C_1$, and $B_1$ have the same number of rows, and $$G_1 \geq 0, \; C_1 \geq 0, \; C_2 > 0. \tag{10}$$

The conditions (10) imply that the matrices G and C satisfy (5). We also assume that the matrix G+sC is a regular matrix pencil, i.e., the matrix G+sC is singular only for finitely many values of s∈C. Clearly, RLC transfer functions of the form (7) are a special case of (8).

3.1 Reduced-Order Models

Let n (<N) denote the desired state-space dimension of a reduced-order model of the original transfer function (8), Z, of state-space dimension N.

A reduced-order model of state-space dimension n is given by a reduced-order transfer function $Z_n$ of the form $$Z_n(s) = B_n^T(G_n+sC_n)^{-1}B_n \tag{11}$$

where $G_n$ and $C_n$ are n×n matrices, and $B_n$ is an n×m matrix. Note that, in order for (11) to be meaningful, the matrix pencil $G_n+sC_n$ needs to be regular.

Reduced-order models (11) can be obtained easily by means of projection. To this end, let $$V_n = [v_1 v_2 \ldots v_n] \tag{12}$$

be any N×n matrix, and set $$G_n = V_n^T G V_n, \; C_n = V_n^T C V_n, \; B_n = V_n^T B. \tag{13}$$

Provided that the matrix $V_n$ is such that the matrix pencil $G_n+sC_n$ is regular, the matrices (13) define a reduced-order model.

3.2 Block Krylov Subspaces

The simple projection (13) results in powerful reduced-order modeling techniques, such as SyMPVL and PRIMA, when the columns of the matrix (12), $V_n$, are chosen as basis vector of certain block Krylov subspaces.

To this end, let $s_0 \in C$ be a suitably chosen expansion point such that the matrix $G+s_0C$ is nonsingular. We can then rewrite (8) as follows:

$$Z(s) = B^T(G + s_0C + (s-s_0)C)^{-1}B \quad (14)$$
$$= B^T(I + (s-s_0)A)^{-1}R \text{ where}$$
$$A = (G+s_0C)^{-1}C, R = (G+s_0C)^{-1}B.$$

We will use block Krylov subspaces induced by the matrices A and R in (14) to generate reduced-order models for (8).

Next, we briefly review the notion of block Krylov subspaces. The matrix sequence R, AR, $A^2R, \ldots, A^{q-1}R, \ldots$ is called a block Krylov sequence. The columns of the matrices in this sequence are vectors of length N, and thus at most N of these columns are linearly independent. By scanning the columns of the matrices in the block Krylov sequence from left to right and deleting each column that is linearly dependent on earlier columns, we obtain the deflated block Krylov sequence $$R_1, AR_2, A^2R_3, \ldots, A^{q_{max}-1}R_{q_{max}}. \quad (15)$$

This process of deleting linearly dependent vectors is called deflation. In (15), each $R_q$ is a submatrix of $R_{q-1}$. Denoting by $m_q$ the number of columns of $R_q$, we thus have $$m \geq m_1 \geq m_2 \geq \ldots \geq m_{q_{max}} \geq 1. \quad (16)$$

By construction, the columns of the matrices (15) are linearly independent, and for each n, the subspace spanned by the first n of these columns is called the n-th block Krylov subspace (induced by A and R), denoted by $K_n$ (A, R).

In the following, we assume that $1 \leq q \leq q_{max}$, is arbitrary, and we set $$n = m_1 + m_2 + \ldots + m_q. \quad (17)$$

Note that, by (16), $n \leq m \cdot q$ with $n = m \cdot q$ if no deflation has occurred. For n in (17), the n-th block Krylov subspace is given by $$K_n(A,R) = \text{colspan} \{R_1, AR_2, \ldots, A^{q-1}R_q\}. \quad (18)$$

3.3 PRIMA and Moment Matching

PRIMA combines projection with block Krylov subspaces. More precisely, the n-th PRIMA model $Z_n$ is defined by (11) and (13), where the matrix (12), $V_n$, is chosen such that its columns span the n-th block Krylov subspace $K_n$ (A, R), i.e., $$\text{span } V_n = K_n(A,R). \quad (19)$$

Although the PRIMA model $Z_n$ is defined by a simple projection, $Z_n$ satisfies a moment-matching property. For the special case $s_0=0$ and basis vectors generated by block Arnoldi without deflation, the moment-matching property has been observed. See A. Odabasioglu, "Provably passive RLC circuit reduction," M.S. Thesis, Department of Electrical and Computer Engineering, Carnegie Mellon University, 1996. This property has been extended to the most general case where possibly nonzero expansion points $s_0$ are allowed and where the underlying block Krylov subspaces allow the necessary deflation of linearly dependent vectors. See R. W. Freund, "Passive reduced-order models for interconnect simulation and their computation via Krylov-subspace algorithms," Proc. 36th ACM/IEEE Design Automation Conference, pp. 195–200, New York, N.Y., 1999. The result can be stated as follows.

THEOREM 1. Let $n = m_1 + m_2 + \ldots + m_q$ and the matrix $V_n$ in (12) satisfy (19). Then, the first q moments in the expansions of Z and the n-th PRIMA model $Z_n$ about $s_0$ are identical:

$$Z(s) = Z_n(s) + O((s-s_0)^q). \quad (20)$$

Recall that, for RLC circuits, the matrices G, C, and B in (8) exhibit the particular block structure (9). However, for the PRIMA reduced-order model, the matrices $G_n$, $C_n$, and $B_n$ in (11) and (13) are dense in general, and in particular, the block structure (9) is not preserved.

Next, we describe the SPRIM reduction technique of the illustrative embodiment of the invention, which preserves the block structure (9) and at the same time, matches twice as many moments as PRIMA.

4. The SPRIM Algorithm

The SPRIM algorithm was motivated by the following insight. In order to have the moment-matching property stated in Theorem 1, it is not necessary that the projection matrix $V_n$ satisfies (19). Instead, let $\tilde{V}_n$ be any matrix, possibly with more than n columns, such that the space spanned by the columns of $\tilde{V}_n$ contains the n-th block Krylov subspace $K_n$ (A, R), i.e., $$K_n(A,R) \subseteq \text{span } \tilde{V}_n. \quad (21)$$

Then, using such a matrix $\tilde{V}_n$, we define a reduced-order model as follows:

$$\tilde{Z}_n(s) = \tilde{B}_n^T(\tilde{G}_n + s\tilde{C}_n)^{-1}\tilde{B}_n, \quad (22)$$

where $$\tilde{G}_n = \tilde{V}_n^T G \tilde{V}_n, \tilde{C}_n = \tilde{V}_n^T C \tilde{V}_n, \tilde{B}_n = \tilde{V}_n^T B. \quad (23)$$

In analogy to Theorem 1, we have the following result.

THEOREM 2. Let $n = m_1 + m_2 + \ldots + m_q$ and let $\tilde{V}_n$ be a matrix, possibly with more than n columns, such that (21) is satisfied. Then, the first q moments in the expansions of Z and the projected model $\tilde{Z}_n$ (defined by (22) and (23)) about $s_0$ are identical:

$$Z(s) = \tilde{Z}_n(s) + O((s-s_0)^q).$$

See R. W. Freund, "Krylov-subspace methods for reduced-order modeling in circuit simulation," J. Comput. Appl. Math., 123(1–2):395–421, 2000, for a proof that is readily extendable to the slightly more general situation of Theorem 2.

Now let $V_n$ again be the basis matrix used in PRIMA. Recall that $V_n$ satisfies (19). Let $$V_n = \begin{bmatrix} V_1 \\ V_2 \end{bmatrix} \quad (24)$$

be the partitioning of $V_n$ corresponding to the block sizes of G and C in (9). We set $$\tilde{V}_n = \begin{bmatrix} V_1 & 0 \\ 0 & V_2 \end{bmatrix}. \quad (25)$$

Together with (19), it follows that $$K_n(A,R) = \text{span } V_n \subseteq \text{span } \tilde{V}_n.$$

Hence, we can project onto the columns of $\tilde{V}_n$, and in view of Theorem 2, we obtain a reduced-order model that matches at least as many moments as PRIMA. In fact, as we will show in the next section, the resulting SPRIM reduced-order model even matches twice as many moments as PRIMA. Furthermore, the special block structure (25) of the matrix $\tilde{V}_n$ implies that the SPRIM reduced-order model $\tilde{Z}_n$ preserves the block structure (9) of the original transfer function Z.

Figure 2:
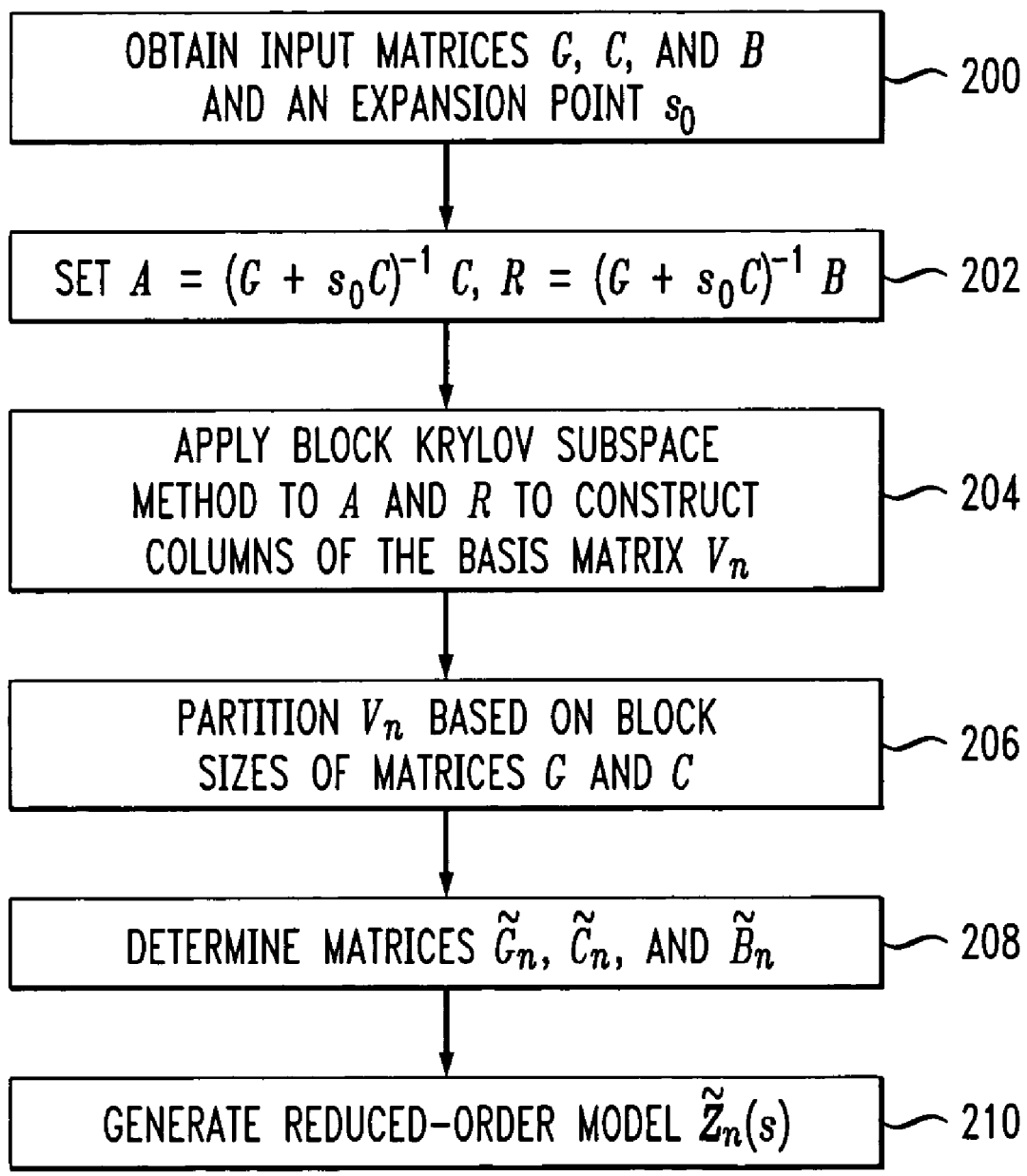
FIG. 2 is a flow diagram of a structure-preserving reduced-order modeling process in accordance with an illustrative embodiment of the invention.

FIG. 2 shows the general steps of the SPRIM algorithm in an illustrative embodiment of the invention.

In step 200, the algorithm receives as input the matrices $$G = \begin{bmatrix} G_1 & G_2^T \\ -G_2 & 0 \end{bmatrix}, C = \begin{bmatrix} C_1 & 0 \\ 0 & C_2 \end{bmatrix}, B = \begin{bmatrix} B_1 \\ 0 \end{bmatrix},$$

where the subblocks $G_1$, $C_1$, and $B_1$ have the same number of rows, and $G_1 \geq 0$, $C_1 \geq 0$, and $C_2 \geq 0$, and an expansion point $s_0$.

In step 202, we set $$A = (G + s_0 C)^{-1} C, \; R = (G + s_0 C)^{-1} B.$$

In step 204, a conventional block Krylov subspace method is applied to A and R, until a sufficient value of n is achieved, in order to construct the columns of the basis matrix $$V_n = [v_1 v_2 \ldots v_n]$$

of the n-th block Krylov subspace $K_n (A, R)$, i.e., span $V_n = K_n(A, R)$.

In step 206, we let $$V_n = \begin{bmatrix} V_1 \\ V_2 \end{bmatrix}$$

be the partitioning of $V_n$, corresponding to the block sizes of G and C.

In step 208, we set $$\tilde{G}_1 = V_1^T G_1 V_1, \; \tilde{G}_2 = V_2^T G_2 V_1,$$

$$\tilde{C}_1 = V_1^T C_1 V_1, \; \tilde{C}_2 = V_2^T C_2 V_2,$$

$$\tilde{B}_1 = V_1^T B_1$$

and determine $$\tilde{G}_n = \begin{bmatrix} \tilde{G}_1 & \tilde{G}_2^T \\ -\tilde{G}_2 & 0 \end{bmatrix}, \tilde{C}_n = \begin{bmatrix} \tilde{C}_1 & 0 \\ 0 & \tilde{C}_2 \end{bmatrix}, \tilde{B}_n = \begin{bmatrix} \tilde{B}_1 \\ 0 \end{bmatrix}. \quad (26)$$

In step 210, we generate the reduced-order model $$\tilde{Z}_n(s) = \tilde{B}_n^T (\tilde{G}_n + s \tilde{C}_n)^{-1} \tilde{B}_n. \quad (27)$$

We remark that the main computational cost of the SPRIM algorithm is running the block Krylov subspace method to obtain $V_n$. This same computational cost is incurred by PRIMA. Thus, generating the PRIMA reduced-order model $Z_n$ and the SPRIM reduced-order model $\tilde{Z}_n$ involves essentially the same computational costs.

5. Properties of SPRIM

In this section, we describe some properties of the SPRIM algorithm.

5.1 Moment Matching

Recall that, in view of Theorem 2, the SPRIM reduced-order model matches at least as many moments as the PRIMA reduced-order model. However, it turns out that the SPRIM model matches even twice as many moments, at least as long as the expansion point $s_0$ is chosen to be a real number, i.e., $s_0 \in R$. Note that, in practice, in order to avoid complex arithmetic, one usually chooses $s_0 \in R$ anyway.

This enhanced moment-matching property can be stated as follows.

THEOREM 3. Let $s_0 \in R$. Let $n = m_1 + m_2 + \ldots + m_q$ and let $\tilde{V}_n$ be the matrix (25) that is used in the SPRIM algorithm. Then, the first $2q$ moments in the expansions of Z and the projected model $\tilde{Z}_n$ (defined by (22) and (23)) about $s_0$ are identical:

$$Z(s) = \tilde{Z}_n(s) + O((s-s_0)^{2q}).$$

For the special case of $s_0 = 0$, the result of this theorem can be traced back to T-J. Su et al., "Model reduction and control of flexible structures using Krylov vectors," J. Guidance Control Dynamics, 14:260–267, 1991. It is relatively straightforward to extend the proof to the general case of $s_0 \in R$.

5.2 Passivity

We now return to the RLC transfer functions Z described in Section 2. Recall that Z is defined by (7) with G, C, B given by (4). In this subsection, we assume that $s_0 \in R$.

It is well known that Z is passive if, and only if, the following three conditions are satisfied:

(i) Z(s) has no poles in $C_+ = \{s \in C | \text{Re } s > 0\}$;

(ii) $Z(\overline{s}) = \overline{Z(s)}$ for all $s \in C$;

(iii) $\text{Re}(x^H Z(s)x) \geq 0$ for all $s \in C_+$ and $x \in C^m$.

In particular, RLC transfer functions Z are passive.

In R. W. Freund, "Passive reduced-order models for interconnect simulation and their computation via Krylov subspace algorithms," Proc. 36th ACM/IEEE Design Automation Conference, pp. 195–200, New York, N.Y., 1999, and R. W. Freund, "Krylov-subspace methods for reduced-order modeling in circuit simulation," J. Comput. Appl. Math., 123(1–2):395–421, 2000, it was shown that reduced-order models of RLC circuits obtained by projection, as described in Section 3, preserve passivity. In particular, this result applies to the SPRIM model, and so we have the following theorem.

THEOREM 4. The SPRIM reduced-order model $\tilde{Z}_n$ given by (22) and (23) is passive.

5.3 Second-Order Form

The original transfer function (8) can be rewritten in so-called second-order form.

Indeed, using the block structure (9), it is easy to verify that the matrix $((G+sC)^{-1}$ in (8) is of the form $$(G + sC)^{-1} = \begin{bmatrix} (Q(s))^{-1} & * \\ * & * \end{bmatrix}, \quad (28)$$

where $$Q(s) = sC_1 + G_1 + \frac{1}{s} G_2^T C_2^{-1} G_2. \quad (29)$$

Inserting (28) into (8), it follows that the transfer function Z can also be rewritten as follows:

$$Z(s) = B_1^T \left(sC_1 + G_1 + \frac{1}{s}G_2^T C_2^{-1} G_2\right)^{-1} B_1, \qquad (30)$$

Moreover, in view of (10), we have that the coefficient matrices of Q in (29) satisfy $$C_1 \geq 0,\ G_1 \geq 0,\ G_2^T C_2^{-1} G_2 \geq 0, \qquad (31)$$

and thus are in particular symmetric. This means that the transfer function (30), Z, is reciprocal; see, e.g., B. D. O. Anderson et al., "Network Analysis and Synthesis," Prentice-Hall, Englewood Cliffs, N.J., 1973.

Since PRIMA does not preserve the block structure (9) of the original transfer function, a PRIMA model cannot be written in second-order form and is not reciprocal in general. The SPRIM model $\tilde{Z}_n$ however, can always be written in second-order form. Indeed, using (26) and (27), it follows that $$\tilde{Z}_n(s) = \tilde{B}_1^T \left(s\tilde{C}_1 + \tilde{G}_1 + \frac{1}{s}\tilde{G}_2^T \tilde{C}_2^{-1} \tilde{G}_2\right)^{-1} \tilde{B}_1,$$

and $$\tilde{C}_1 \geq 0,\ \tilde{G}_1 \geq 0,\ \tilde{G}_2^T \tilde{C}_2^{-1} \tilde{G}_2 \geq 0.$$

Hence, the SPRIM model preserves reciprocity, and thus can be more easily synthesized as an actual circuit.

6. Numerical Examples

In this section, we present some numerical examples that illustrate the higher accuracy of SPRIM reduced-order models relative to conventional PRIMA reduced-order models.

6.1 A PEEC Circuit

The first example is a circuit resulting from the so-called partial element equivalent circuit (PEEC) discretization of an electromagnetic problem. See A. E. Ruehli, "Equivalent circuit models for three-dimensional multiconductor systems," IEEE Trans. Microwave Theory Tech., 22:216–221, 1974. The circuit is an RLC network consisting of 2100 capacitors, 172 inductors, and 6990 inductive couplings, driven by a single resistive source. The circuit is formulated as a 2-port component. We compare the PRIMA and SPRIM models corresponding to the same dimension n of the underlying block Krylov subspace. The expansion point $s^0 = 2\pi \times 10^9$ was used.

Figure 3:
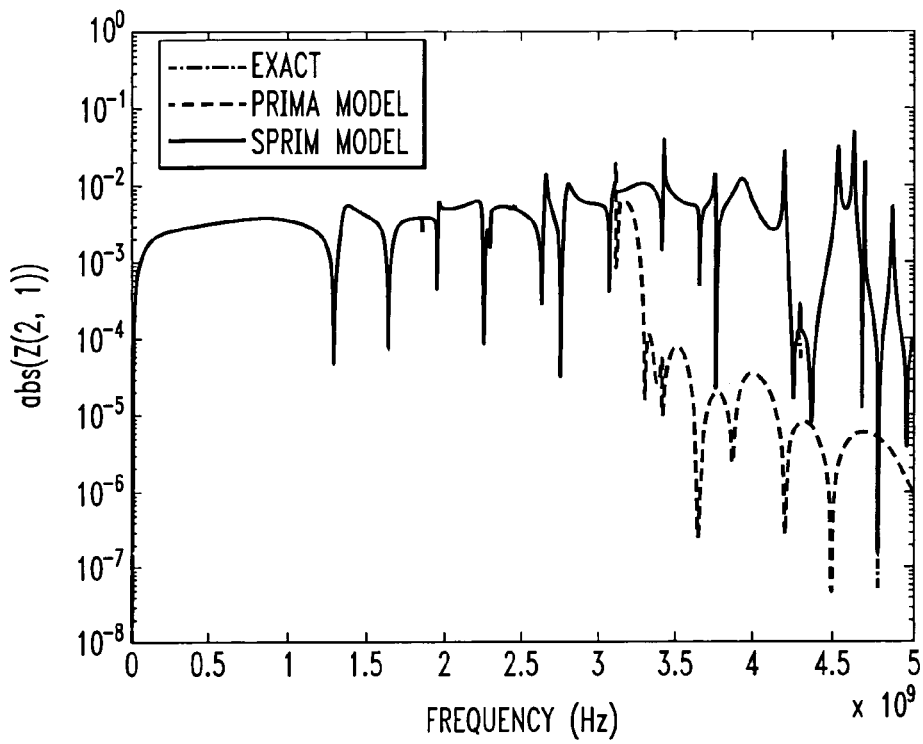
FIGS. 3, 4, 5 and 6 show examples of graphical representations of frequency response signals generated using the modeling process of FIG. 2 in the circuit analysis system of FIG. 1.

FIG. 3 shows a plot of the absolute value of the (2,1) component of the 2×2-matrix-valued transfer function over the frequency range of interest. The dimension n=120 was sufficient for SPRIM to match the exact transfer function. The corresponding PRIMA model of the same dimension, however, has not yet converged to the exact transfer function in large parts of the frequency range of interest. This example illustrates the better approximation properties of SPRIM relative to PRIMA, generally attributable to the ability of SPRIM to match twice as many moments as PRIMA.

6.2 A Package Model

The second example is a 64-pin package model used for an RF integrated circuit. Only eight of the package pins carry signal, the rest being either unused or carrying supply voltages. The package is characterized as a 16-port component (8 exterior and 8 interior terminals). The package model is described by approximately 4000 circuit elements, resistors, capacitors, inductors, and inductive couplings. We again compare the PRIMA and SPRIM models corresponding to the same dimension n of the underlying block Krylov subspace. The expansion point $s_0 = 5\pi \times 10^9$ was used.

Figure 4:
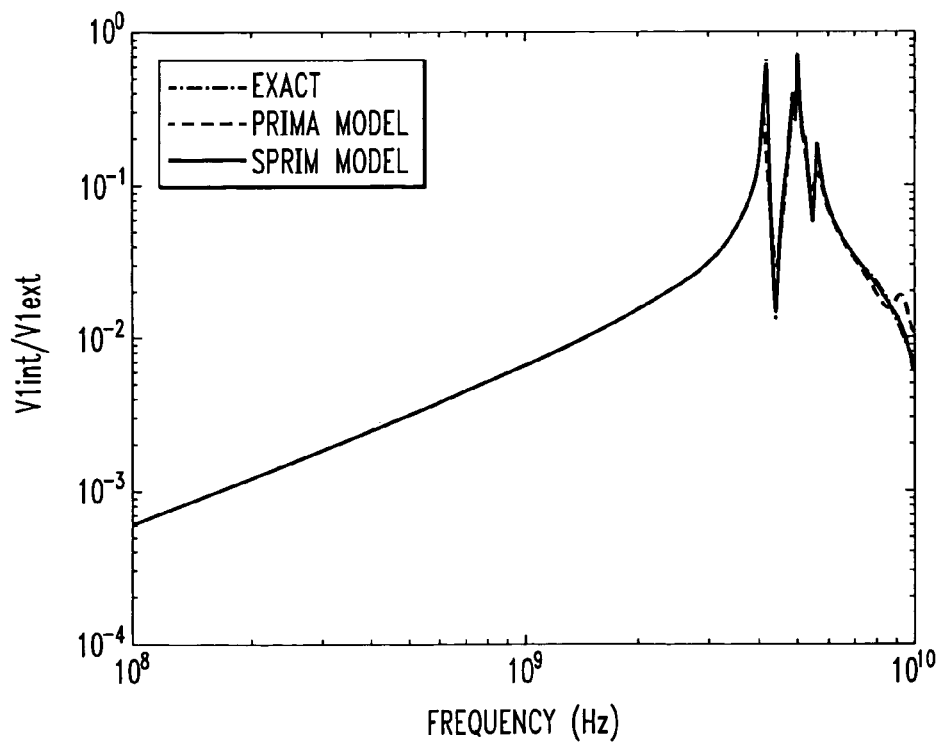
Figure 5:
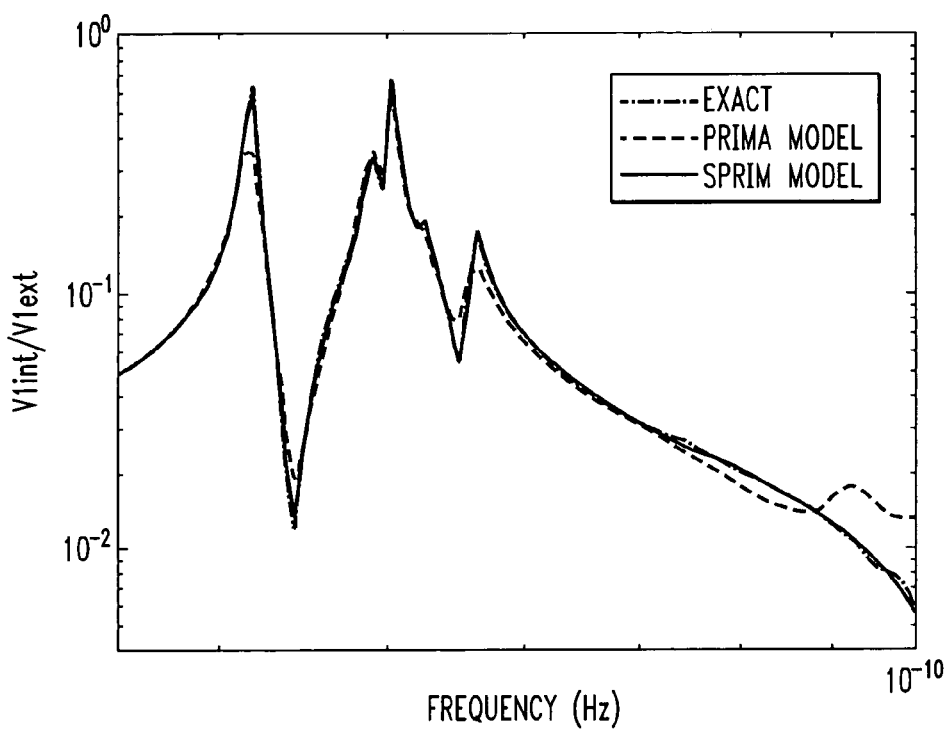

FIG. 4 shows a plot of the absolute value of one of the components of the 16×16-matrix-valued transfer function over the frequency range of interest. The dimension n=80 was sufficient for SPRIM to match the exact transfer function. The corresponding PRIMA model of the same dimension, however, does not match the exact transfer function very well for high frequencies. This is more readily apparent from the plot of FIG. 5, which shows a more detailed view of a portion of the FIG. 4 plot.

6.3 A Mechanical System

Exploiting the equivalence between RLC circuits and mechanical systems, both PRIMA and SPRIM can also be applied to reduced-order modeling of mechanical systems. Such systems arise, for example, in the modeling and simulation of MEMS devices.

Figure 6:
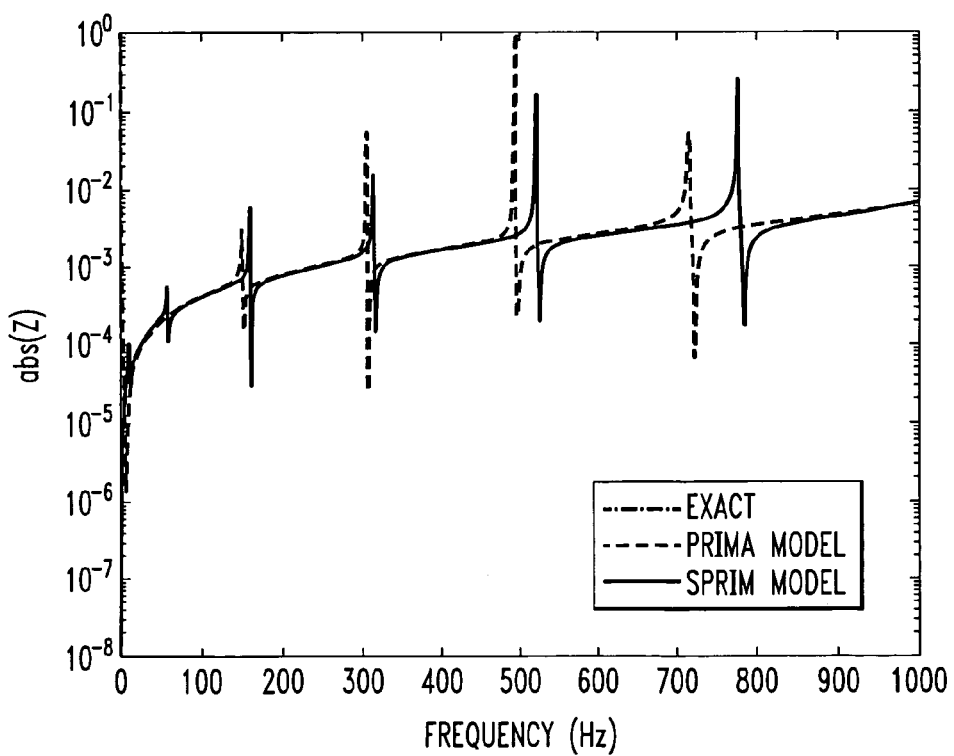

FIG. 6 shows a comparison of PRIMA and SPRIM for a finite-element model of a shaft. The expansion point $s^0 = \pi \times 10^3$ was used. The dimension n=15 was sufficient for SPRIM to match the exact transfer function in the frequency range of interest. The corresponding PRIMA model of the same dimension, however, has not converged to the exact transfer function in large parts of the frequency range of interest. This example also illustrates the better approximation properties of SPRIM, due to matching of twice as many moments as PRIMA.

It should again be emphasized that the above-described embodiments of the invention are intended to be illustrative only. The techniques of the invention may be applied to any modeling or other analysis application involving a circuit, device or system, without regard to the type, arrangement or configuration of the circuit, device or system being analyzed or the analysis system utilized to perform the modeling or other analysis.

Thus, although described in the context of a particular structure-preserving reduced-order interconnect modeling process, the techniques of the invention can be modified in a straightforward manner so as to be utilizable in a wide variety of other applications. For example, the techniques of the invention can be implemented using block subspaces other than the particular block subspaces of the illustrative embodiments.

Also, in alternative embodiments the particular steps utilized in a given modeling process may be varied from those steps shown in the FIG. 2 process.

Furthermore, the assumptions relied upon to facilitate the description of the illustrative embodiments should not be construed as requirements of the invention. One or more of such assumptions need not apply in a given alternative embodiment of the invention.

These and numerous other alternative embodiments within the scope of the following claims will be readily apparent to those skilled in the art.

I claim:

1. An apparatus for generating a signal characterizing a circuit, device or system, the apparatus comprising:

a processing unit having a processor coupled to a memory; and an output unit coupled to the processing unit;

the processing unit being configured to generate a reduced-order model of the circuit, device or system by projection of input matrices characterizing the circuit, device or system onto at least one block subspace, the block subspace having a corresponding basis matrix;

the projection utilizing at least one matrix that has a column range which includes a corresponding portion of the block subspace but is not itself the basis matrix of the block subspace;

the processing unit being further configured to generate the signal characterizing the circuit, device or system based at least in part on the reduced-order model;

the output unit being configured to present the generated signal in a user-perceptible format.

2. The apparatus of claim 1 wherein the block subspace comprises a block Krylov subspace.

3. The apparatus of claim 2 wherein the projection utilizes a plurality of matrices, and wherein each such matrix has a column range which include a corresponding portion of the block Krylov subspace but is not itself a basis matrix of the block Krylov subspace.

4. The apparatus of claim 2 wherein the input matrices comprise matrices G, C, and B having the block structure $$G = \begin{bmatrix} G_1 & G_2^T \\ -G_2 & 0 \end{bmatrix}, \quad C = \begin{bmatrix} C_1 & 0 \\ 0 & C_2 \end{bmatrix}, \quad B = \begin{bmatrix} B_1 \\ 0 \end{bmatrix}.$$

5. The apparatus of claim 4 wherein parameters A and R are determined from the input matrices G, C, and B as $$A = (G + s_0 C)^{-1} C, \quad R = (G + s_0 C)^{-1} B$$

where $s_0$ denotes a designated expansion point.

6. The apparatus of claim 5 wherein the parameters A and R are utilized to construct columns of the basis matrix of the block Krylov subspace, the basis matrix being given by $$V_n = [v_1 v_2 \ldots v_n]$$

where n denotes a dimension of the reduced-order model.

7. The apparatus of claim 6 wherein the basis matrix of the block Krylov subspace is partitioned into a first matrix $V_1$ and a second matrix $V_2$ as follows $$V_n = \begin{bmatrix} V_1 \\ V_2 \end{bmatrix}$$

based on block sizes of the input matrices G and C.

8. The apparatus of claim 7 wherein the projection of the input matrices G, C, and B onto the block Krylov subspace is determined utilizing the first matrix $V_1$ and the second matrix $V_2$.

9. The apparatus of claim 8 wherein the projection of the input matrices G, C, and B onto the block Krylov subspace is determined as $$\tilde{G}_n = \begin{bmatrix} \tilde{G}_1 & \tilde{G}_2^T \\ -\tilde{G}_2 & 0 \end{bmatrix}, \quad \tilde{C}_n = \begin{bmatrix} \tilde{C}_1 & 0 \\ 0 & \tilde{C}_2 \end{bmatrix}, \quad \tilde{B}_n = \begin{bmatrix} \tilde{B}_1 \\ 0 \end{bmatrix}$$

where $$\tilde{G}_1 = V_1^T G_1 V_1, \quad \tilde{G}_2 = V_2^T G_2 V_1,$$

$$\tilde{C}_1 = V_1^T C_1 V_1, \quad \tilde{C}_2 = V_2^T C_2 V_2,$$

$$\tilde{B}_1 = V_1^T B_1.$$

10. The apparatus of claim 9 wherein the reduced-order model comprises a transfer function of the form $$\tilde{Z}_n(s) = \tilde{B}_n^T (\tilde{G}_n + s \tilde{C}_n)^{-1} \tilde{B}_n.$$

11. The apparatus of claim 10 wherein the reduced-order model as represented in second-order form is given by $$\tilde{Z}_n(s) = \tilde{B}_1^T \left( s \tilde{C}_1 + \tilde{G}_1 + \frac{1}{s} \tilde{G}_2^T \tilde{C}_2^{-1} \tilde{G}_2 \right)^{-1} \tilde{B}_1.$$

12. The apparatus of claim 5 wherein the expansion point $s_0$ is selected as a real number.

13. The apparatus of claim 1 wherein the signal comprises a frequency response of the circuit, device or system.

14. The apparatus of claim 1 wherein the reduced-order model provides an improved approximation of the circuit, device or system relative to a PRIMA reduced-order model of said circuit, device or system, by matching approximately twice as many moments as the PRIMA reduced-order model.

15. The apparatus of claim 1 wherein the reduced-order model preserves passivity properties of the circuit, device or system.

16. The apparatus of claim 1 wherein reduced-order model preserves reciprocity properties of the circuit, device or system.

17. The apparatus of claim 16 wherein the reduced-order model can be represented in a second-order form.

18. A processor-implemented method for use in an analysis system comprising a processing unit and an output unit, the processing unit having a processor coupled to a memory, the method comprising the step of:

generating a reduced-order model of a circuit, device or system by projection of input matrices characterizing the circuit, device or system onto at least one block subspace, the block subspace having a corresponding basis matrix;

the projection utilizing at least one matrix that has a column range which includes a corresponding portion of the block subspace but is not itself the basis matrix of the block subspace;

wherein a signal characterizing the circuit, device or system is generatable in the processing unit based at least in part on the reduced-order model, the signal being presentable in a user-perceptible format via the output unit.

19. The method of claim 18 wherein the block subspace comprises a block Krylov subspace.

20. An article of manufacture comprising a machine-readable medium storing one or more programs for use in an analysis system comprising a processing unit and an output unit, the processing unit having a processor coupled to a memory, the one or more programs when executed in the processor performing the step of:

generating a reduced-order model of a circuit, device or system by projection of input matrices characterizing the circuit, device or system onto at least one block subspace, the block subspace having a corresponding basis matrix;

the projection utilizing at least one matrix that has a column range which includes a corresponding portion of the block subspace but is not itself the basis matrix of the block subspace;

wherein a signal characterizing the circuit, device or system is generatable in the processing unit based at least in part on the reduced-order model, the signal being presentable in a user-perceptible format via the output unit.

* * * * *